United States Patent [19]

Harada et al.

[11] Patent Number: 4,631,820
[45] Date of Patent: Dec. 30, 1986

[54] MOUNTING ASSEMBLY AND MOUNTING METHOD FOR AN ELECTRONIC COMPONENT

[75] Inventors: Yuji Harada, Tokyo; Hayato Shinohara, Yokohama, both of Japan

[73] Assignee: Canon Kabushiki Kaisha, Tokyo, Japan

[21] Appl. No.: 764,594

[22] Filed: Aug. 9, 1985

[30] Foreign Application Priority Data

Aug. 23, 1984 [JP] Japan ................................. 59-175665
Aug. 23, 1984 [JP] Japan ................................. 59-175666
Aug. 23, 1984 [JP] Japan ................................. 59-175667

[51] Int. Cl.$^4$ .......................... H05K 3/34; H05K 1/18
[52] U.S. Cl. ........................................ 29/840; 361/401;
361/398; 361/403; 361/405; 174/52 FP;
174/68.5; 357/69
[58] Field of Search .............. 174/52 FP, 68.3, 577 R,
174/577 C; 29/832, 840, 577 R, 557 C;
361/400, 401, 404, 406, 398, 403, 405; 357/69,
68, 170

[56] References Cited

U.S. PATENT DOCUMENTS

| | | | |
|---|---|---|---|
| 3,192,307 | 6/1965 | Lazar | 174/68.5 |
| 3,501,832 | 3/1970 | Iwata et al. | 29/840 |
| 3,597,660 | 8/1971 | Jensen | 174/52 FP X |
| 3,614,832 | 10/1971 | Chance et al. | 174/68.5 X |
| 4,380,357 | 4/1983 | Evans et al. | 29/832 X |
| 4,538,210 | 8/1985 | Schaller | 361/401 |

OTHER PUBLICATIONS

IBM Tech. Discl. Bull., vol. 11, No. 8, Jan. 1969, p. 990, by Stephans.
IBM Tech. Discl. Bull., vol. 20, No. 12, May 1978, p. 5142, by Larnerd.

*Primary Examiner*—Mark Rosenbaum
*Assistant Examiner*—Carl J. Arles
*Attorney, Agent, or Firm*—Spencer & Frank

[57] ABSTRACT

An electronic component and a wiring pattern on a printed board are connected electrically by a sheet connector having a conducting layer formed on a surface of an insulating sheet. This provides a mounting assembly for an electronic component which can make simultaneous connection easily and accurately between electrodes of the electronic component, and between electrodes of the printed board, as well as connecting the electronic component and the printed board.

8 Claims, 14 Drawing Figures

FIG_5
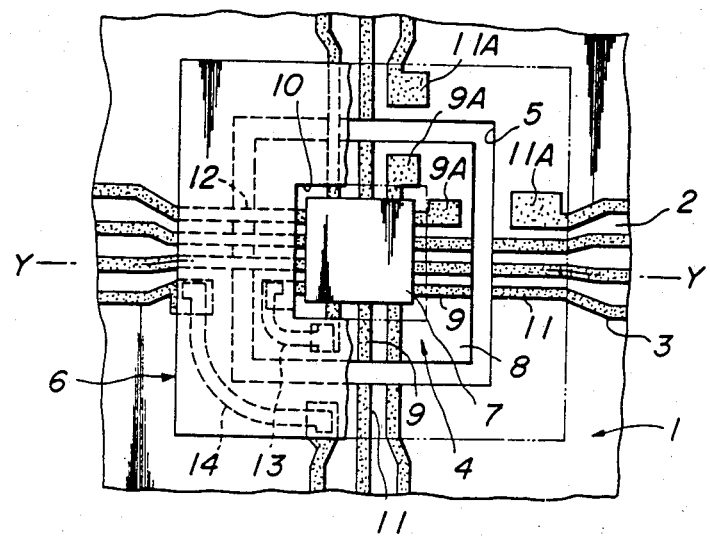
FIG_6
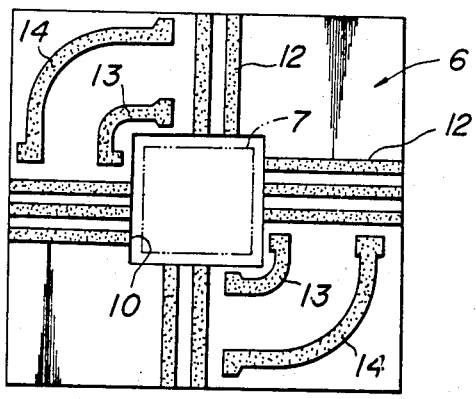
FIG_7
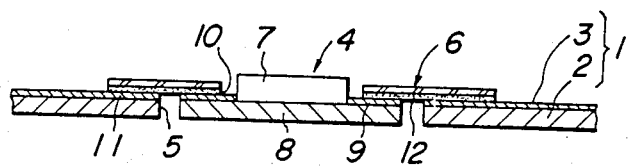

FIG_8
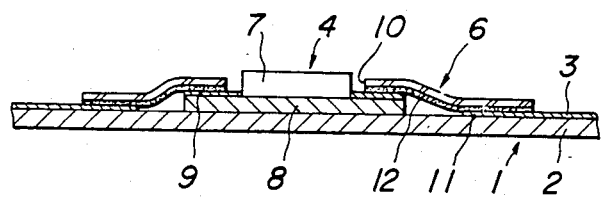
FIG_9
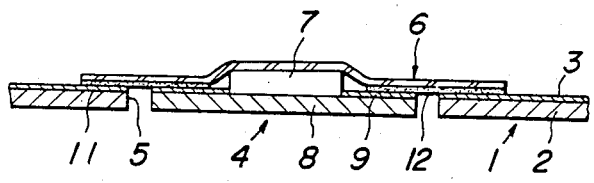

MOUNTING ASSEMBLY AND MOUNTING METHOD FOR AN ELECTRONIC COMPONENT

BACKGROUND OF THE INVENTION

1. Field of the Invention

The present invention relates to a mounting assembly and a mounting method for an electronic component, and more particularly to a mounting assembly and a mounting method for disposing an integrated circuit, an LSI, a chip resistor or a chip capacitor on a printed board.

2. Description of the Prior Art

In electronic devices such as calculators and personal computers, electrical circuits are arranged by disposing IC (integrated circuits), LSI (Large-Scale Integration), resistors and capacitors on a printed board on which wiring patterns are formed.

Base materials such as flexible plastic sheet, hard paper-phenol resin board or glass-epoxy resin board on which are formed conducting patterns of conductive material, or film carrier tape are used as printed boards.

Various components are used as electronic components such as integrated circuits, LSI and diodes on which several to a large number of leads are arranged around the perimeter of the component body, or items such as chip resistors and chip capacitors which do not have any leads.

In these types of conventional mounting assemblies, however, the electrodes (or leads) of an electronic component were fixed directly to the wiring patterns on the printed board by solder or a conductive adhesive.

Such conventional arrangements suffered from several problems. Alignment of the positions of the electrodes on the electronic component and on the printed board was difficult, and accurate connection required considerable effort. Connecting the electronic component to the printed board, connecting the electrodes of the electronic component to each other, and connecting the electrodes of the printed board to each other required separate processes, resulting in a large number of steps. Concentrated stresses arose easily in the connecting portions between electrodes, leading to the peeling off of electrodes. When the connecting section between the electronic component and the printed board was thick, a long time was required to heat it, impeding the efficiency of connecting operations.

Furthermore, in such conventional arrangements, the thickness of the electronic component formed protrusions on the printed board, so that such arrangements could not be used as thin mounting assemblies.

Moreover, in the case of an electronic component such as an LSI which has electrodes around its perimeter, the LSI body is inserted into an opening formed in the printed board, and the peripheral electrodes are connected by overlaying them on the printed board. Such peripheral electrodes have considerable thickness which forms protrusions on the printed board. Accordingly, with this arrangement, it is difficult to form a thin mounting assembly.

SUMMARY OF THE INVENTION

It is, therefore, an object of the present invention to provide a mounting assembly for an electronic component that resolves the disadvantages of such prior art arrangements.

It is another object of the present invention to provide a mounting assembly for an electronic component that makes connections simply and accurately between electrodes of an electronic component and electrodes of a printed board, between electrodes of an electronic component, and between electrodes of a printed circuit board, and that provides a thin mounting assembly.

It is a further object of the present invention to provide a mounting method that resolves the disadvantages of conventional arrangements.

It is another object of the present invention to provide a mounting method for an electronic component that makes connections simply and accurately between electrodes of an electronic component and electrodes of a printed board, between electrodes of an electronic component, and between electrodes of a printed circuit board, and that provides a thin mounting assembly.

In order to achieve the above objects, in the first aspect of the present invention, a mounting assembly for an electronic component comprises:

a printed board having an insulated board and a wiring pattern on at least one surface of the insulating board;

an electronic component having electrodes; and a sheet connector having an insulating sheet and a conducting layer on a surface of the insulating sheet for connecting electrically a wiring pattern on the printed board to an electrode of the electronic component by the conducting layer.

Here, the electronic component can include an integrated circuit or an LSI encapsulated in a mold case having a plurality of electrodes around a perimeter of the mold case.

An electrical connection may be made between electrodes of the electronic component, and/or between wiring patterns of the printed board through a conducting layer of the sheet connector.

The sheet connector may have an opening smaller than the electronic component and larger than the mold case of the electronic component.

The electronic component may have electrodes opposed to each other at opposite ends of the electronic component.

The printed board may have an opening larger than the electronic component, and the electronic component may be positioned inside the opening.

The insulating sheet may be transparent and the conducting layer may be made of conductive adhesive.

The insulating sheet may be transparent and the conducting layer may be formed of a cream solder.

In the second aspect of the present invention, a mounting assembly for an electronic component comprises:

a printed board having an insulated board and a wiring pattern on at least one surface of the insulating board;

an electronic component having electrodes; and a sheet connector having a flexible and insulating sheet and a conducting layer on a surface of the flexible and insulating sheet for connecting electrically a wiring pattern on the printed board to an electrode of the electronic component by the conducting layer.

Here, the electronic component may be disposed on the surface of the printed board.

The printed board may have an opening larger than the electronic component. The electronic component may be positioned inside the opening. The sheet connector may cover the surface of the electronic component.

In the third aspect of the present invention, a method for mounting an electronic component on a printed board, comprises the steps of:

disposing a conducting layer on a surface of a film-like insulating sheet to form a sheet connector; and connecting electrically the conducting layer to an electrode of the electronic component and to a wiring pattern formed on the surface of the printed board, thereby assembling an electronic component on the printed board.

Here, the connection between the conducting layer on the sheet connector and the electrode of the electronic component and a wiring pattern of the printed board may be made by hot-pressing.

The electronic component can include an integrated circuit or an LSI having a plurality of electrodes around a perimeter of a molded portion of the electronic component.

An electrical connection may be made between electrodes of the electronic component, and/or between wiring patterns of the printed board through the conducting layer of the sheet connector.

The sheet connector may have an opening smaller than the electronic component and larger than the molded portion of the electronic component.

The electronic component may have electrodes at opposite ends of the electronic component.

The printed board may have an opening larger than the electronic component, and the electronic component may be positioned inside the opening.

The film-like insulating sheet may be transparent and the conducting layer may be made of conductive adhesive.

The film-like insulating sheet may be transparent and the conducting layer may be formed of a cream solder.

The above and other objects, effects, features and advantages of the present invention will become more apparent from the following description of preferred embodiments thereof taken in conjunction with the accompanying drawings.

BRIEF DESCRIPTION OF THE DRAWINGS

FIG. 5 is a partially cut plan view showing another embodiment of a mounting assembly for an electronic component according to the present invention;

FIG. 6 is a bottom view showing a sheet connector shown in FIG. 5;

FIG. 7 is a cross-sectional view taken along line Y—Y in FIG. 5;

FIG. 8 and FIG. 9 are respectively cross-sectional views of further embodiments of mounting assemblies for an electronic component according to the present invention;

DETAILED DESCRIPTION OF PREFERRED EMBODIMENTS

An explanation will be made below of the various embodiments with reference to the drawings.

Embodiment 1

Figure 1:
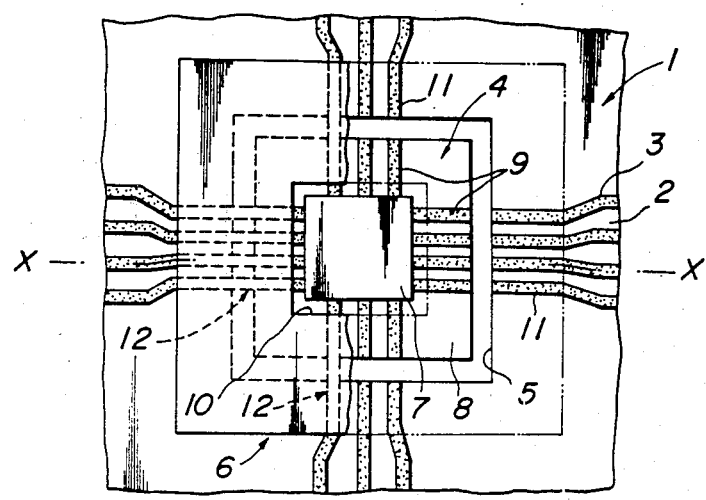
FIG. 1 is a partially cut plan view showing an embodiment of a mounting assembly for an electronic component according to the present invention.
Figure 2:
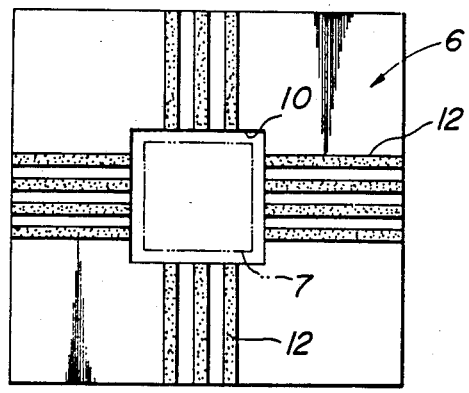
FIG. 2 is a bottom view showing a sheet connector shown in FIG. 1.
Figure 3:
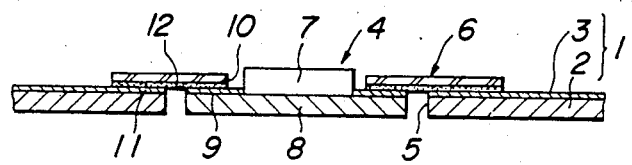
FIG. 3 is a cross-sectional view taken along line X—X in FIG. 1.

FIGS. 1 to 3 show a mounting assembly for an electronic component when such electronic component is an LSI having a plurality of lead electrodes around its perimeter. FIG. 1 is a partially cut plan view of the mounting assembly. FIG. 2 is a bottom view of a sheet connector shown in FIG. 1. FIG. 3 is a cross-sectional view along line X—X in FIG. 1.

In FIG. 1 and FIG. 3, printed board 1 is composed of an insulating sheet 2 and a wiring pattern 3 formed on the insulating sheet 2. The insulating sheet 2 is made of a material such as flexible polyester sheet, hard paper-phenol resin board or glass-epoxy resin board. The wiring pattern 3 is formed by screen printing of a conducting material such as copper on to a surface of the insulating sheet 2 or by etching a material such as copper foil which is applied in advance to the insulating sheet 2. An opening 5, larger than the external shape of an electronic component 4, is formed at a predetermined position on the printed board 1. The electronic component 4 is positioned inside the opening 5, and in this condition is connected to the printed board through a sheet connector 6, where the opening includes a notch.

In this embodiment, the electronic component 4 includes an LSI. Reference numeral 7 denotes a molded or sealed LSI chip, and reference numeral 8 denotes an insulating board made from a material such as plastic or ceramic. In one case, electrodes of the LSI chip are bonded to a plurality of conducting patterns 9 formed on the insulating board 8, and the LSI chip is molded by plastic material. In another case, electrodes of an LSI chip sealed in a ceramic housing are connected to conducting patterns 9. In this arrangement, the electronic component 4 has a plurality of lead electrodes 9 around the perimeter of the molded portion 7.

The sheet connector 6 has a conducting layer 12 as shown in FIG. 2 formed on a surface of a flexible insulating sheet made of a plastic film such as polyester (for example, polyethylene terephthalate). The sheet connector 6 is cut into desired dimensions and shape, and in the present embodiment, has an opening 10 in which the molded portion 7 of the electronic component is inserted. The conducting layer 12 is formed by printing a conductive adhesive, conducting paste or cream solder on to a surface of the sheet connector 6. The pattern on the conducting layer 12 is so formed to align with the electrodes 9 of the electronic component 4, and with the wiring pattern 3 on the printed board 1 that corresponds to the electrodes 9.

A method of connecting the electrodes 9 of the electronic component 4 and the wiring pattern 3 of the printed board 5 using the sheet connector 6 will be explained with reference to FIG. 3 and FIGS. 4A to 4C.

In these drawings, the conducting layer 12 of the sheet connector 6 comprises a silver film 21, a conducting paste layer 22 having a resin 22B such as acrylic resin or epoxy resin in which a conductor powder 22A such as silver is dispersed, and an adhesive layer 23 of a material such as acrylic resin or epoxy resin which covers the silver film 21 and the conducting paste layer 22.

Figure 4A:
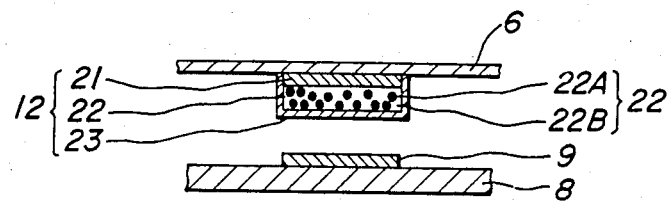
FIGS. 4A–4C are cross sectional views for illustrating a method for applying a sheet connector in accordance with the present invention.
Figure 4B:
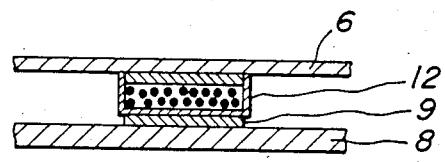

As shown in FIG. 4A, the conducting layer 12 of the sheet connector 6 is positioned above and opposite to the electrodes 9 of the above-mentioned electronic component 4 in FIG. 3, and the sheet connector 6 covers the insulating board 8 of the electronic component 4 so that the conducting layer 12 overlays the electrodes 9, as shown in FIG. 4B.

Next, the sheet connector 6 is pressed on to the insulating board 8 using a head 24. It is most desirable at this time that the head 24 be heated at a temperature, for example, between 120° C. and 150° C. so that it performs hot pressing. By hot pressing like this, the paste layer 22 becomes thinner, so that the conductor powders 22A contact strongly each other. The silver film 21 in the sheet connector 6 and the electrodes 9 on the top of the insulating board 8 are connected electrically through the paste layer 22. At the same time, the sheet connector 6 and the insulating board 8 are adhered to each other by the adhesive 23. By connecting the ends of the wiring pattern 3 on the printed board 1 that correspond to the electrodes 9 of the electronic component to the conducting layer 12 of the sheet connector 6 in the same manner, the lead electrodes 9 of the electronic component and corresponding electrodes (connecting portions) 11 of the wiring pattern 3 on the printed board 1 are connected electrically by the sheet connector 6.

Figure 4C:
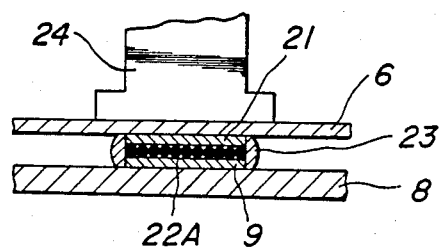

The composition of the conducting layer 12 is not limited to the three-layers arrangement shown in FIGS. 4A–4C. The conducting layer 12 may be formed by a two-layer arrangement of a conducting paste 22 and an adhesive 23 without a silver film 21. An arrangement is also acceptable in which an adhesive 23 exists only on the side surfaces of a silver film 21 and a conducting paste 22, without covering the surface of the conducting paste 22.

When the conducting layer 12 of the sheet connector 6 is formed of cream solder, the conducting layer 12 can be overlaid opposite to the electrodes 9 of the electronic component 4 and to the wiring pattern 3 of the printed board 1. The cream solder is heated and melted so that the conducting layer 12 is connected to the electrodes 9 and the wiring pattern 3.

It is preferable that a transparent sheet is used as the insulating sheet on the sheet connector 6 so as to overlay the conducting layer 12 on the electrodes 9 and the wiring pattern 3.

Embodiment 2

FIGS. 5 to 7 show another example of a mounting assembly for an electronic component (includes LSI) having the same arrangement as the electronic component in Embodiment 1.

In these drawings, an opening 5 larger than the electronic component 4 is formed at a predetermined position on the printed board 1. The electronic component 4 is connected through the sheet connector 6 when the electronic component is positioned in the opening 5.

As shown in FIG. 5 and FIG. 6, the sheet connector 6 has an opening 10 larger than a molded portion 7 formed in its central portion. On the connecting face of the sheet connector 6 is formed a conducting layer 12 which connects electrically the electrodes 9 of the electronic component and the corresponding electrodes (connecting portions) 11 of the wiring pattern 3. Furthermore, a conducting layer 13 for connecting electrically predetermined electrodes 9A and 9A of the electronic component to each other, and a conducting layer 14 for connecting electrically electrodes 11A and 11A of a predetermined wiring pattern 3 to each other are formed on the connecting surface of the sheet connector 6, as shown in FIG. 6.

By connecting the sheet connector 6 in this manner by the method described in Embodiment 1, the electronic component 4 is connected to the printed board 1 in the predetermined conducting condition, and at the same time the predetermined electrodes 9A and 9A of the electronic component 4 and the predetermined electrodes 11A and 11A of the printed board 1 are also connected electrically.

Embodiment 3

FIG. 8 shows a further embodiment of a mounting assembly for an electronic component (includes LSI) having the same arrangement as the electronic component in Embodiments 1 and 2. In the present embodiment, no opening (such as the opening 5 in FIG. 1 and FIG. 3) is formed on the printed board 1, and the electronic component 4 is disposed on the surface of the printed board 1. Consequently, there is a level gap equivalent to the thickness of the insulating board 8 between the electrodes 9 of the electronic component 4 and the wiring pattern 3 (or the electrodes 11) of the printed board 1, so that the sheet connector 6 connects the electrodes 9 of the electronic component 4 to the electrode 11 of the printed board 1 in a condition distended by this drop in level. The method of connection by the sheet connector 6 is the same as the method described in Embodiment 1.

Embodiment 4

FIG. 9 shows a still further embodiment of the present invention. In this embodiment, the opening 5 is formed in the printed board 1, but no hole is formed in the sheet connector 6 (such as the opening 10 in FIGS. 1 to 3). The sheet connector 6, therefore, connects the electrodes 9 to the electrodes 11 by the method described in Embodiment 1 when it covers the surface of the molded portion 7. The other aspects of the present embodiment are essentially the same as in FIGS. 1 to 3. Corresponding portions are shown with the same reference numbers, and their explanation is omitted.

Embodiment 5

Figure 10:
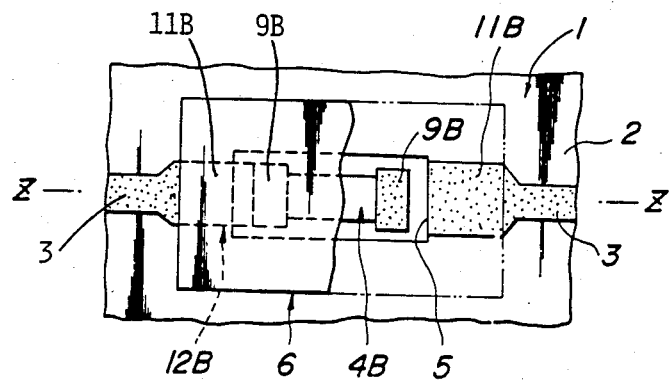
FIG. 10 is a partially cut plan view showing a still further embodiment of a mounting assembly for an electronic component according to the present invention.
Figure 11:
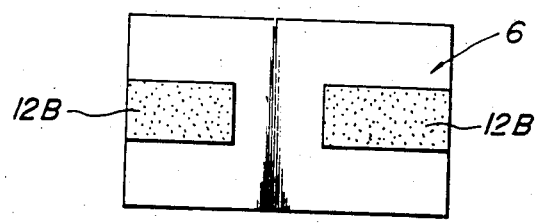
FIG. 11 is a bottom view showing a sheet connector shown in FIG. 10.
Figure 12:
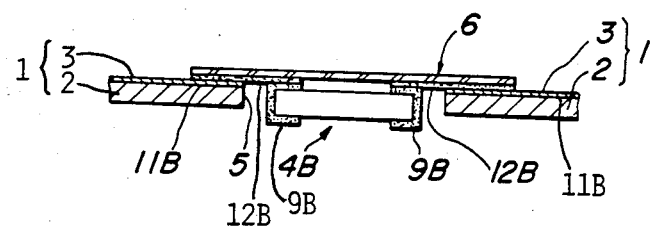
FIG. 12 is a cross-sectional view taken along line Z—Z in FIG. 10.

FIGS. 10 to 12 show an embodiment of a mounting assembly according to the present invention for an electronic component such as a chip resistor or a chip capacitor which does not have lead electrodes. FIG. 10 is a partially cut plan view. FIG. 11 is a bottom view of a sheet connector shown in FIG. 10. FIG. 12 is a cross-sectional view along line Z—Z in FIG. 10.

Portions in FIGS. 10 to 12 which correspond to portions in FIGS. 1 to 3 are shown respectively with the same reference numerals. Unless a special explanation is made of a particular feature, the arrangements shown in these sets of drawings are essentially the same.

In FIG. 10 and FIG. 12, the opening 5 larger than the external shape of the electronic component (a chip component) 4B is formed in the printed board 1. The chip component 4B is positioned in the opening 5, and is connected to the printed board 1 through the sheet connector 6 as shown in FIG. 12.

The electrodes 9B and 9B are disposed at both ends of the chip component 4B. The ends (connecting portions) 11B and 11B of the wiring patterns 3 and 3 of the printed board 1 comprise electrodes corresponding respectively to the above-mentioned electrodes 9B and 9B.

As shown in FIG. 11, a conducting layer 12B is formed on the contacting surface of the sheet connector 6 so as to connect electrically the corresponding electrodes 9B and 11B to each other. This conducting layer 12B can be formed of a material such as a conducting adhesive similar to those in the embodiments explained above.

Consequently, the conducting layer 12B on the sheet connector 6 is connected to the electrode 9B of the electronic component 4B and to the end portion 11B of the wiring pattern 3 on the printed board 1 by the method described above as shown in FIG. 12, so that the chip component 4B is connected electrically under a predetermined conducting condition to the printed board 1 through the sheet connector 6. Note that when the adhesive strength of the conducting layer 12B alone is not sufficient, suitable adhesion can be made with an insulating adhesive using portions other than the conducting layer 12B.

In this embodiment, no opening corresponding to the opening 10 in FIGS. 1 to 3 is formed in the sheet connector 6.

As explained above, the present invention has the following advantages.

(i) An electronic component is electrically connected to a printed board by a film-like sheet connector, so that electrodes and a corresponding wiring pattern are aligned easily, and are connected accurately and speedily. Using a transparent sheet in this situation facilitates such alignment even further.

(ii) Since connection is made through a thin and flexible sheet connector, the stress is not concentrated in the connecting portions with the electrode, thereby also eliminating peeling off of the electrodes. Moreover, the electronic component can be supported under a floating condition, thereby providing freedom of dimensions in the direction of the thickness of the electronic component when installing in an electronic apparatus.

(iii) Even when the electronic component and the printed board are thick, the connecting portions can be heated from the sheet connector side regardless of this thickness, so that it is easy to apply heat to the connecting portions, and the number of assembling steps is reduced.

(iv) Because connection is made with a conducting layer formed on the sheet connector, a connection can be performed with more accurate and stable thickness compared to conventional solder connections.

(v) An electronic component and a printed board are connected by simply using a sheet connector, and at the same time, the required electrical connections are made between electrodes of an electronic component. Furthermore, electrical connections can be made freely between the required wiring patterns on a printed board without passing through the electronic components (include LSI).

(vi) An electronic component is positioned inside the opening in the printed board, and the electronic component is adhered and connected to the printed board on the same plane of the film-like sheet connector, so that a flat, thin-type mounting and connection is made.

What is claimed is:

1. A mounting assembly for an electronic component having a packaging portion and electrodes extending therefrom, said mounting assembly comprising
    a supporting member for supporting one surface of the packaging portion and the electrodes of said electronic component;
    a printed board including an insulating board and a wiring pattern on the surface thereof; and
    a sheet connector including a flexible insulating sheet and a conducting layer affixed to a surface thereof, said conducting layer electrically connecting the wiring pattern on the surface of said printed board to electrodes of said electronic component, an opening being provided in said sheet connector having an area smaller than the area of the surface of said supporting member and larger than the area of said one surface of said packaging portion supported by said supporting member, the surface of said packaging portion opposite said one surface being exposed to the outside of the assembly.

2. A mounting assmebly as claimed in claim 1, wherein said printed board has an opening therein having an area which is larger than the area of the surface of said supporting member on which said electronic component is supported, said electronic component being positioned within the opening in said printed board.

3. A mounting assembly for an electronic component having a packaging portion and electrodes extending therefrom, said mounting assembly comprising
    a supporting member for supporting one surface of the packaging portion and the electrodes of said electronic component;
    a printed board including an insulating board and a wiring pattern on the surface thereof; and
    a sheet connector including a flexible insulating sheet and a conducting layer affixed to a surface thereof, said conducting layer electrically connecting at least one of an electrode of said electronic component to the wiring pattern on said printed board, one electrode of said electronic component to another electrode of said electronic component and one portion of the wiring pattern on said printed board to another portion of the wiring pattern on said board.

4. A mounting assembly as claimed in claim 3 wherein said sheet connector is provided with an opening having an area smaller than the area of the surface of said supporting member and larger than the area of said one surface of said packaging portion supported by said supporting member, the surface of said packaging portion opposite said one surface being exposed to the outside of the assembly.

5. A mounting assembly as claimed in claim 4, wherein said printed board has an opening therein having an area which is larger than the area of the surface of said supporting member on which said electronic component is supported, said electronic component being positioned within the opening in said printed board.

6. A method of mounting an electronic component, having a packaging portion and electrodes extending therefrom, on a printed board having a wiring pattern formed thereon, said method comprising the steps of:
    forming a sheet connector having an opening therein by disposing a conducting layer on a surface of a film-like insulating sheet;

supporting said electronic component on a supporting member having a conductive pattern formed on the surface thereof;

connecting electrically an electrode of said electronic component to the conductive pattern on said supporting member;

laying said sheet connector on said electronic component and said printed board so that said electronic component is positioned inside the opening in said sheet connector; and connecting electrically said connecting layer to an electrode of said electronic component and to the wiring pattern on said printed board, thereby assembling said electronic component on said printed board.

7. A mounting method as claimed in claim 6, wherein an electrical connection is made by the conducting layer of said sheet connector between at least one of the electrodes of said electronic component and the wiring pattern of said printed board.

8. A mounting method as claimed in claim 6, wherein said printed board is formed with an opening therein having an area which is larger than the area of the surface of said supporting member on which said electronic component is supported, said electronic component being positioned within the opening in said printed board.

* * * * *